United States Patent … US 11,152,573 B2
Vazan et al. … Oct. 19, 2021

(54) SHADOW MASK COMPRISING A GRAVITY-COMPENSATION LAYER AND METHOD OF FABRICATION

(71) Applicant: eMagin Corporation, Hopewell Junction, NY (US)

(72) Inventors: Fridrich Vazan, Pittsford, NY (US); Evan P. Donoghue, Hopewell Junction, NY (US); Ilyas I. Khayrullin, Hopewell Junction, NY (US); Tariq Ali, Hopewell Junction, NY (US); Kerry Tice, Hopewell Junction, NY (US); Amalkumar P. Ghosh, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 501 days.

(21) Appl. No.: 15/968,325

(22) Filed: May 1, 2018

(65) Prior Publication Data

US 2018/0315925 A1    Nov. 1, 2018

Related U.S. Application Data

(60) Provisional application No. 62/492,684, filed on May 1, 2017.

(51) Int. Cl.
  C23C 14/24   (2006.01)
  C23C 14/04   (2006.01)
  H01L 51/00   (2006.01)

(52) U.S. Cl.
  CPC ........ H01L 51/0011 (2013.01); C23C 14/042 (2013.01); C23C 14/24 (2013.01); H01L 51/001 (2013.01)

(58) Field of Classification Search
  CPC ... H01L 51/56; H01L 51/0011; C23C 16/345; C23C 16/56; C23C 14/24; C23C 14/042
  See application file for complete search history.

(56) References Cited

U.S. PATENT DOCUMENTS 4,919,749 A * 4/1990 Mauger .................... G03F 1/20
                                                204/192.3
9,142,779 B2    9/2015 Chan et al.
(Continued)

OTHER PUBLICATIONS

J. G. E. Gardeniers et al., "LPCVD silicon-rich silicon nitride films for applications in micromechanics, studied with statistical experimental design", "J. Vac. Sci. Technol. A", dated Sep. 1, 1996, pp. 2879-2892, vol. 14, No. 5, Publisher: American Vacuum Society.
(Continued)

*Primary Examiner* — Dah-Wei D. Yuan
*Assistant Examiner* — Nga Leung V Law
(74) *Attorney, Agent, or Firm* — Kaplan Breyer Schwarz, LLP

(57) ABSTRACT

A shadow mask that includes compensation layer operative for at least partially correcting gravity-induced sag of a shadow-mask membrane is disclosed. The compensation layer is formed on a surface of the shadow-mask membrane such that the compensation layer is characterized by a residual stress that gives rise to a first bending moment in the membrane, where the first bending moment is directed in the opposite direction to a second bending moment in the membrane that is induced by the effect of gravity.

11 Claims, 5 Drawing Sheets

(56) References Cited

U.S. PATENT DOCUMENTS

2015/0041793 A1* 2/2015 Chan ................ H01L 51/56
257/40
2017/0342542 A1 11/2017 Ghosh et al.

OTHER PUBLICATIONS

Non-Final Office Action received for U.S. Appl. No. 15/968,443, dated Mar. 19, 2020.
Fu-Ching Tung et al., "OLED Fabrication by Using a Novel Planar Evaporation Technique", http://dx/doi.org/10.1155/2014/683037, "International Journal of Photoenergy", dated Jun. 22, 2014, p. 8 vol. 2014, No. Article ID 683037, Publisher: Hindawi Publishing Corporation, Published in: TW.

* cited by examiner

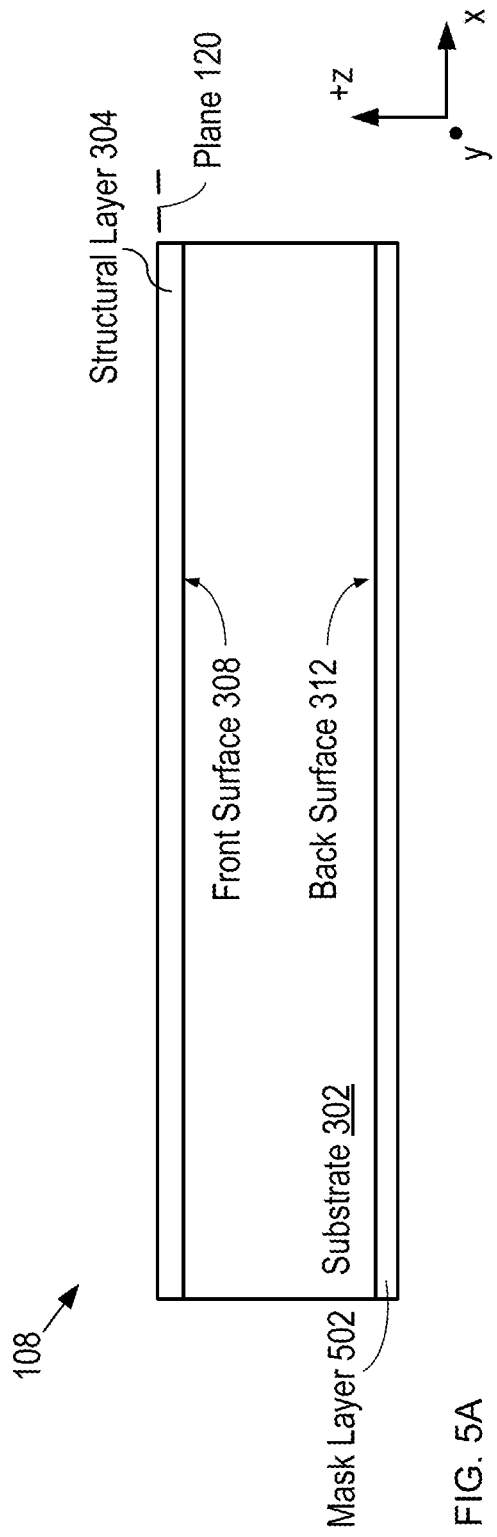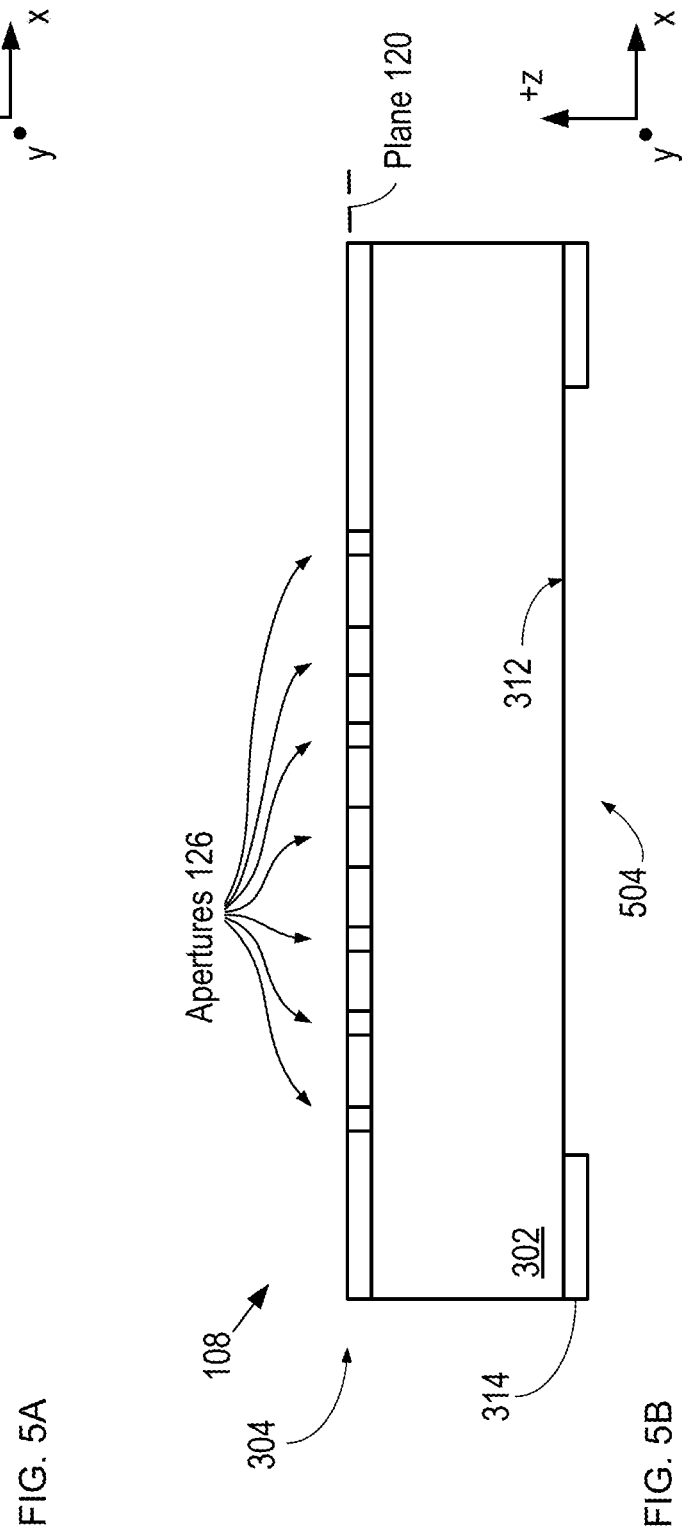

SHADOW MASK COMPRISING A GRAVITY-COMPENSATION LAYER AND METHOD OF FABRICATION

STATEMENT OF RELATED CASES

This case claims priority to U.S. Provisional Patent Application Ser. No. 62/492,684 filed on May 1, 2017, which is incorporated herein by reference.

TECHNICAL FIELD

The present disclosure relates to material deposition in general, and, more particularly, to direct patterning of a material layer on a substrate via deposition of the material onto the substrate through a shadow mask.

BACKGROUND

Semiconductor fabrication requires the formation of one or patterned layers of material on the surface of a substrate. The most common approach for forming a material pattern is to deposit a full-surface layer of the material over the entire surface of the substrate and then remove the material everywhere except where it is desired. This is commonly referred to as "subtractive patterning."

Unwanted material is removed in a multi-step process in which a layer of photoresist is formed over the material layer and illuminated with a pattern of light that is based on the desired material pattern. After it has been exposed, the photoresist covering the unwanted material is dissolved in a strongly basic developer solution, which leaves behind a photoresist mask that covers the material to remain on the substrate. An etchant is then used to remove the exposed material, thus patterning the material pattern as desired. Afterward, the photoresist mask must be removed and the substrate must be thoroughly cleaned to ensure no residue of photoresist or etch product remains on any of its surfaces.

During a subtractive patterning process, everything on the substrate (i.e., any previously defined structures and materials, etc.) is exposed to harsh chemicals, including the photoresist developer solution, the etchant used to pattern the material layer, and the chemicals used to clean the substrate. Unfortunately, many materials, such as organic and biological materials, cannot survive exposure to one or more of these chemicals. As a result, subtractive patterning cannot be used for such "sensitive materials" or to pattern any material layer formed subsequent to deposition of a sensitive material on a substrate. For such operations, therefore, a direct patterning process must be used.

A direct patterning process forms a desired pattern of material as it is deposited, thereby avoiding the need for post-deposition treatments and the harsh chemicals they normally involve. One such direct-patterning process is shadow-mask deposition, which is analogous to stencil-based printing techniques, such as stencil painting, silk screen printing, and the like.

During shadow-mask deposition, vaporized molecules of the material are generated such that they flow from a source toward the substrate surface. The vaporized molecules can be generated via any of a variety of processes, such as evaporation, sputtering, and the like. A thin layer of structural material having a pattern of apertures (i.e., openings) that matches the pattern desired for the deposited material (referred to as a "shadow mask") is positioned just in front of (but typically not in contact with) the substrate surface. When the flow of material reaches the shadow mask, the passage of material to the substrate is blocked everywhere except at the apertures. As a result, the material layer is directly patterned during its deposition on the substrate and no additional post-deposition processing is required.

Historically, shadow-mask deposition has been used in semiconductor fabrication to define patterns of relatively large (>50 micron) features, such as wire-bond pads, etc. A typical shadow mask used in such applications includes a thin, patterned metal sheet held by an annular frame. While the minimum feature size and minimum separation between apertures for such shadow masks is quite large (typically greater than several tens of microns), such shadow masks are perfectly suitable for defining large-feature-size, sparse patterns of material like wire-bond pad patterns.

More recently, it has become desirable to employ shadow-mask deposition in the formation of electronic devices based on organic materials, such as organic light-emitting diodes (OLED), active-matrix OLED displays, organic solar cells, biological-material-based sensors, and the like. In many cases, much higher resolution and pattern density is required than can be achieved with a conventional metal-layer-based shadow mask. As a result, high-performance shadow masks have been developed that enable feature sizes and pattern densities that are less than or equal to ten microns.

Such high-performance shadow masks typically have a very thin (<1 micron) layer of structural material (e.g., silicon nitride, silicon, etc.) disposed on an annular frame formed from a semiconductor or glass handle substrate. The apertures are formed in the thin structural layer, after which the center portion of the handle substrate is removed, leaving the central region of the structural layer as a patterned edge-supported membrane.

Theoretically, during shadow-mask deposition, material deposits only on the surface of the substrate in those regions located directly behind the apertures. In practice, however, as the vaporized molecules travel from the source to the shadow mask, many vaporized molecules propagate along directions that are not perfectly normal to the shadow mask and substrate. As a result, some vaporized molecules continue to travel laterally after passing through the shadow mask such that the resultant patterned regions extend beyond the edges of the apertures. The magnitude of this lateral spreading of the features (referred to as "feathering") is a function of the separation distance between the substrate surface and the shadow mask, which is preferably very small—a few microns at most, as well as the orientation of the source relative to the center of the shadow mask.

While feathering is not a critical issue when forming large, widely spaced features (e.g., wire-bond pads, etc.), it can be highly problematic when forming small-feature, highly dense patterns. In fact, feathering has been a limiting factor for the minimum feature size and pattern density attainable using shadow-mask deposition.

Furthermore, many applications, such as high-resolution OLED display fabrication, require dense patterns of small features (<10 microns) that extend over a large area (greater than tens of centimeters). This requires a shadow mask that is both very thin (to mitigate shadowing and enable fine feature definition) and very large (lateral extents of tens of centimeters). Unfortunately, thin, large-area membranes exhibit significant gravity-induced sag. For shadow masks of several inches in diameter, such sag can give rise to a significant variation (several microns or more) in the separation distance between the substrate surface and the shadow mask over the area of the shadow mask. This, in turn, leads to increased feathering near the center of the shadow mask and an overall variation in the magnitude of the feathering that occurs across the area of the deposited pattern.

To mitigate the effect of gravity-induced shadow-mask sag in the prior-art, a mechanical grid of support material is sometimes placed under the shadow mask membrane. Alternatively, regions of the shadow mask substrate can be left intact during its fabrication to provide support over the area of the membrane. Unfortunately, these approaches give rise to shadowing effects that lead to poor deposition uniformity over the surface area of the substrate.

The need for a shadow-mask capable of defining high-resolution directly deposited layers without shadowing remains, as yet, unmet in the prior art.

SUMMARY

The present disclosure presents apparatus and methods that enable direct patterning of dense arrangements of very small features via shadow-mask deposition without some of the costs and disadvantages of the prior art. Embodiments in accordance with the present disclosure mitigate shadow-mask sag due to gravity, thereby enabling directly patterned layers having smaller minimum features and higher pattern density. Embodiments in accordance with the present disclosure are particularly well suited for use in fabricating organic light-emitting diodes (OLEDs), OLED displays, organic solar cells, and the like.

Embodiments in accordance with the present disclosure include one or more compensation layers that are added to a previously fabricated shadow-mask membrane, where the compensation layers provide a restoring force that at least partially compensates for the effect of gravity on the structural layer.

An illustrative embodiment of the present disclosure is a shadow mask comprising a structural layer of low-tensile-stress silicon nitride, where the structural layer is patterned with an arrangement of through-holes in a first region. The first region is located over a cavity formed in the substrate such that the first region is a suspended membrane. A compensation layer is disposed on the inner surface (i.e., the surface proximal to the cavity) of the membrane, where the compensation layer comprises a material characterized by compressive stress. As a result, the compressive stress of the compensation layer induces a bending moment in the combined layer structure that manifests as a restoring force on the structural layer directed normal to the membrane surface and outward from the substrate. The thickness and residual stress of the compensation layer are selected to compensate for the effect of gravity on the structural layer when the shadow mask is oriented horizontally. As a result, the restoring force and the force due to gravity substantially cancel each other out realizing a substantially flat shadow mask.

In some embodiments, the compensation layer is disposed on the top surface (distal to the substrate) of the structural layer. In some such embodiments, the compensation layer and structural layer are characterized by residual tensile stresses where the compensation layer has a lower tensile stress than the structural layer. In some such embodiments, the structural layer is substantially stress free.

In some embodiments, the compensation layer includes a plurality of sub-layers.

In some embodiments, the structural layer comprises a material other than low-stress silicon nitride. In some embodiments, the structural layer comprises single-crystal silicon.

In some embodiments, the compensation layer is designed to give rise to a restoring force that is directed inward toward the handle substrate.

An embodiment in accordance with the present disclosure is a shadow mask comprising: a substrate that defines a first plane, the substrate including a cavity; a structural layer that is disposed on the substrate, the structural layer comprising a first material, and the structural layer having a first region that includes an aperture pattern comprising at least one aperture, wherein the structural layer has a first thickness and a first residual stress, and wherein the first region is disposed over the cavity and defines a membrane; and a compensating layer having a second thickness and a second residual stress, the compensating layer comprising a second material, wherein a compensating layer is in physical contact with the structural layer in the first region; wherein the compensating layer induces a first bending moment in the membrane, and wherein at least a component of the first bending moment is directed along a direction that is substantially normal to the first plane.

Another embodiment in accordance with the present disclosure is a method for forming a shadow mask, the method comprising: providing a substrate that defines a first plane; forming a structural layer on the substrate, the structural layer comprising a first material, the first layer having a first thickness and a first residual stress; defining an aperture pattern in a first region of the structural layer, wherein the aperture pattern includes at least one aperture, and wherein the at least one aperture extends completely through the structural layer; forming a cavity in the substrate, wherein the cavity is formed after the formation of the structural layer, and wherein the formation of the cavity releases the first region of the structural layer to define a membrane; and forming a compensation layer in physical contact with the first region, the compensation layer comprising a second material and having a second thickness and second residual stress; wherein the second thickness and second residual stress are selected such that the compensation layer induces a first bending moment in the structural layer, the first bending moment being directed along a direction that is substantially normal to the first plane.

BRIEF DESCRIPTION OF THE DRAWINGS

FIG. 5A depicts a schematic drawing of a cross-sectional view of nascent shadow mask 108 after the formation of structural layer 304 on front surface 308 and mask layer 502 on back surface 312.

FIG. 5B depicts a schematic drawing of a cross-sectional view of nascent shadow mask 108 after the definition of apertures 126 and mask 314.

DETAILED DESCRIPTION

Figure 1:
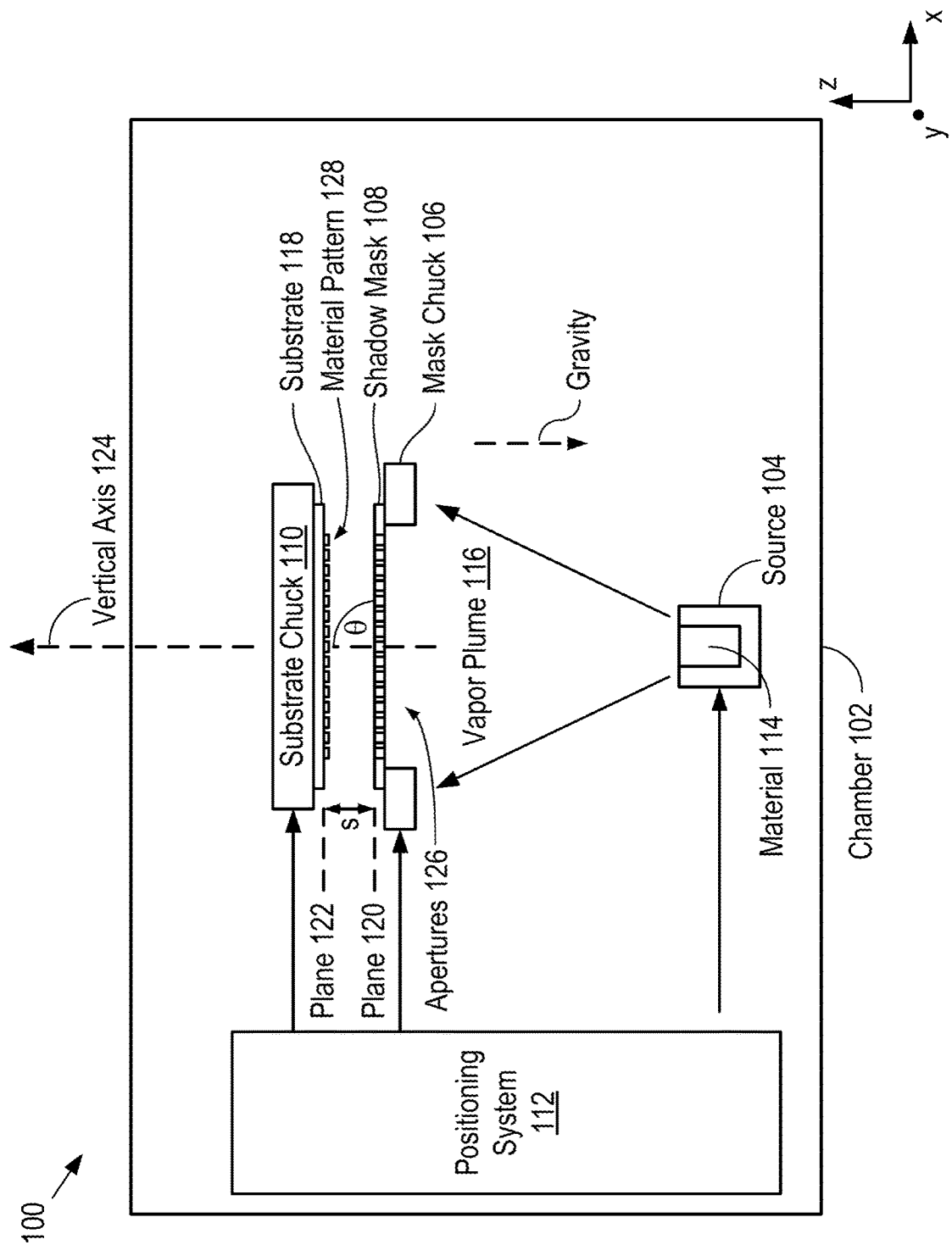
FIG. 1 depicts a schematic drawing of an illustrative embodiment of a shadow-mask deposition system in accordance with the present disclosure.

FIG. 1 depicts a schematic drawing of an illustrative embodiment of a shadow-mask deposition system in accordance with the present disclosure. System 100 includes vacuum chamber 102, source 104, mask chuck 106, shadow mask 108, substrate chuck 110, and positioning system 112. System 100 is a vertical deposition system for directly patterning an OLED material layer on substrate 118.

Vacuum chamber 102 is a conventional pressure vessel operative for providing a low-pressure atmosphere that supports evaporation of material 114. It should be noted that vacuum chamber 102 can be a standalone unit, part of a cluster deposition system, or part of a track-deposition system where multiple evaporation chambers are arranged in linear chain. In some embodiments, vacuum chamber 102 includes several evaporation sources/shadow mask combinations that enable formation of different patterns of different materials.

Source 104 is crucible for vaporizing material 114 to create vapor plume 116. In the depicted example, material 114 is an organic material suitable for use in an OLED and source 104 acts substantially as a point source for the vaporized material because the open area of its crucible is significantly smaller than the area of substrate 118.

In some embodiments, source 104 is a linear evaporation source that comprises a plurality of nozzles arranged along a longitudinal axis such that the nozzles collectively emit a fan-shaped vapor plume of vaporized molecules of material 114. In some embodiments, positioning system 112 moves the linear source along a direction that is unaligned with its longitudinal axis in the x-y plane to improve the uniformity of the deposited material on substrate 118. In some embodiments, this path is a line that is substantially orthogonal to both the linear arrangement of nozzles and normal axis 124. In some of embodiments, the linear source is moved along a non-linear path in the x-y plane.

In some embodiments, source 104 includes a two-dimensional arrangement of nozzles, each of which emits a conically shaped vapor plume such that the plurality of nozzles collectively provides a flow of vaporized molecules that is substantially uniform over the area of the substrate surface. In some embodiments, positioning system 112 moves the two-dimensional arrangement of nozzles to facilitate deposition uniformity. In some embodiments, the two-dimensional arrangement of nozzles is rotated in-plane to facilitate deposition uniformity.

In some embodiments, source 104 is a two-dimensional planar source that includes a layer of material 114 distributed across its top surface. The source is arranged such that this top surface is parallel to and facing substrate 118. When heated, material 114 vaporizes uniformly across the plane. Exemplary planar evaporation sources suitable for use in embodiments in accordance with the present disclosure are disclosed by Tung, et al., in "OLED Fabrication by Using a Novel Planar Evaporation Technique," Int. J. of Photoenergy, Vol. 2014(18), pp. 1-8 (2014), which is incorporated herein by reference.

In some embodiments, positioning system 112 imparts a relative motion between source 104 and the combination of substrate 118 and shadow mask 108 to improve the uniformity with which material 114 deposits over the two-dimensional surface area of substrate 118. The relative motion is imparted by moving at least one of the substrate/mask combination and the source. In some embodiments, a collimator (not shown) is inserted between source 104 and shadow mask 108 such that only vaporized molecules of material 114 traveling along directions aligned, or nearly aligned, with vertical axis 124. The inclusion of such a collimator can improve the uniformity with which material 114 deposits over the two-dimensional surface area of substrate 118. Collimators suitable for use in embodiments in accordance with the present disclosure are described in U.S. Patent Publication No.: 2017/0342542, which is incorporated herein by reference.

Mask chuck 106 is a mechanical clamp that locates shadow mask 108 between source 104 and substrate 118.

Shadow mask 108 is a plate of structural material that includes a plurality of apertures whose size and arrangement are based on the desired deposition pattern for material 114. The surface of shadow mask 108 proximal to substrate 118 defines plane 120. Shadow mask 108 is described in more detail below and with respect to FIG. 3.

Substrate chuck 110 is a platen for securing substrate 118 such that the substrate is as flat as possible.

Substrate 118 is a glass substrate suitable for supporting the planar-processing-based fabrication of an OLED display. In some embodiments, substrate 118 is a different conventional substrate, such as a semiconductor wafer (e.g., silicon, gallium arsenide, indium phosphide, etc.), composite substrate, etc., that is suitable for planar processing. The surface of substrate 118 that is proximal to shadow mask 108 defines plane 122.

Positioning system 112 is a multi-dimensional alignment system for controlling the relative positions of substrate 118, source 104, and shadow mask 108. In operation, positioning system 112 aligns the shadow mask and substrate such that they are separated by separation, s, (typically a few tens or hundreds of microns) along vertical axis 124, planes 120 and 122 are substantially parallel, and the apertures of the shadow mask are aligned with their respective deposition sites on substrate 118. In the depicted example, vertical axis 124 is aligned with the direction of gravity and shadow mask 108 and substrate 118 are held such that each of planes 120 and 122 is substantially orthogonal with vertical axis 124 (i.e., $\theta=90°$). In some embodiments, shadow mask 108 and substrate 118 are held such that each of planes 120 and 122 is at an angle, $\theta$, other than 90° to with respect to the direction of gravity.

When heated, source 104 melts material 114 to generate vapor plume 116. As discussed above, vapor plume 116 includes vaporized molecules having propagation directions that span a relatively large angular range. As a result, vaporized molecules travel some lateral distance after passing through the apertures of the shadow mask—referred to as "feathering." Feathering gives rise to deposition of material 114 in unintended regions of the substrate, which causes enlargement of the deposited features and/or undesirable intermixing of different materials deposited in different depositions. Feathering, therefore, can limit the minimum feature size of a deposited pattern, as well as pattern density.

The amount of feathering that occurs is determined by the lateral and rotation alignments between planes 120 and 122, the separation, s, between them, and the range of propagation angles of the vaporized molecules incident on the shadow mask.

As discussed above, while prior-art shadow masks are theoretically flat, in practice they sag in the center due to the fact that most of the shadow mask is mechanically unsupported. As a result, a cross-section through any diameter of a prior-art shadow-mask membrane assumes a substantially catenary shape (approximately a hyperbolic cosine function) such that its top surface is non-planar.

Figure 2:
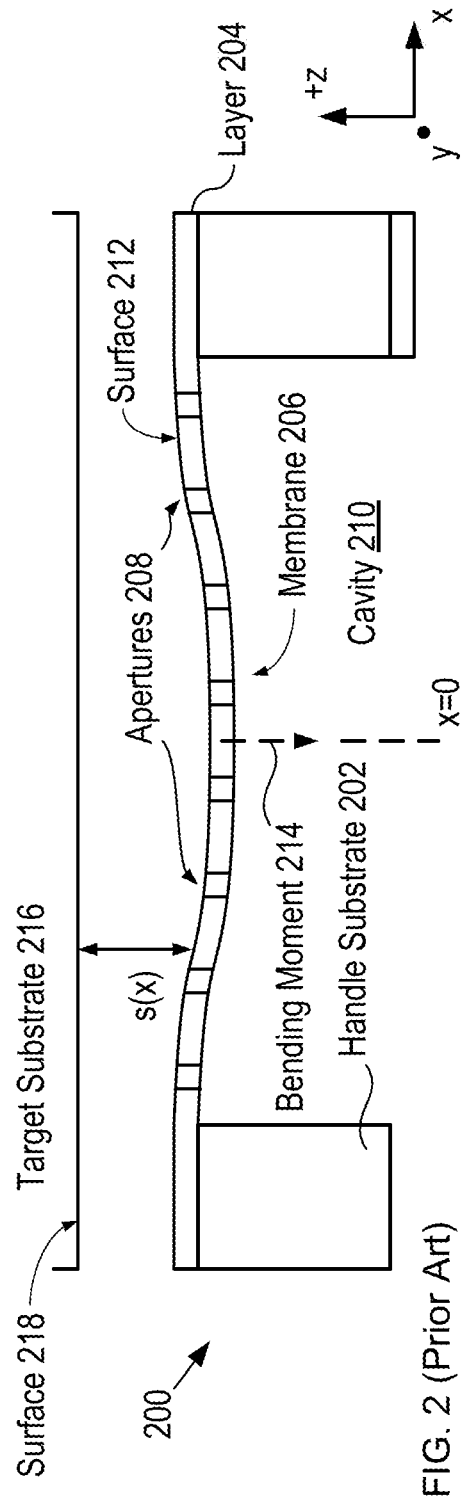
FIG. 2 depicts a schematic drawing of a cross-sectional view of an exemplary high-resolution shadow mask in accordance with the prior art.

FIG. 2 depicts a schematic drawing of a cross-sectional view of an exemplary high-resolution shadow mask in accordance with the prior art. Shadow mask 200 is analogous to high-resolution shadow masks disclosed in U.S. Pat. No. 9,142,779, which is incorporated herein by reference.

Shadow mask 200 comprises layer 204, which is a layer of structural material disposed on the top surface of handle substrate 202. Cavity 210 is formed in substrate 202 to release the central portion of layer 204, thereby defining membrane 206. Membrane 206 includes apertures 208, which are formed to enable passage of vaporized molecules through the shadow mask and deposit in a desired pattern on surface 218 of target substrate 216.

Layer 204 is a one-micron-thick layer of silicon-rich silicon nitride. The silicon content in layer 204 is chosen to reduce the magnitude of its residual tensile stress to approximately 300 MPa from the residual tensile stress of approximately 1 GPa for stoichiometric silicon nitride (i.e., Si3N4). One skilled in the art will recognize that stoichiometric silicon nitride has a residual tensile stress that is approximately 1 GPa. As a result, stoichiometric silicon nitride is typically not suited for use as the structural material in a membrane having a size suitable for use as a shadow masks since its high stress would lead to membrane fracture immediately upon release. By depositing silicon nitride under conditions that realize a material having a silicon content greater than that of stoichiometric silicon nitride (i.e., $Si_3N_4$), the resultant so-called "silicon-rich silicon nitride" can have much lower tensile stress (and can even be made compressive). The use of low-stress silicon nitride, therefore, enables shadow mask membranes that can have suitably large areas.

As noted above, because of the large lateral dimensions of membrane 206 and the low residual tensile stress in layer 204, the effect of gravity on the membrane gives rise to a bending moment (i.e., bending moment 214) that causes the membrane to sag under its own weight. As a result, the separation between the top surface 212 of mask 200 and surface 218 of target substrate 216 is non-uniform and a function of radial distance from the center of the membrane, s(x). The non-uniformity of this separation exacerbates the problem of feathering for prior-art shadow-mask-based direct patterning.

It is an aspect of the present disclosure, however, that membrane sag can be mitigated by disposing a compensation layer on the structural layer of the shadow-mask membrane. A compensation layer in accordance with the present disclosure has a thickness and residual stress that give rise to a force on the structural layer that opposes the effect of gravity on the membrane. When the shadow mask is oriented in a plane normal to gravity, the gravity-induced bending moment is countered by the stress-induced bending moment to reduce the sag of the membrane. Preferably, the gravity-induced bending moment and stress-induced bending moment are substantially equal such that they cancel each other out to realize a substantially flat shadow mask.

Figure 3:
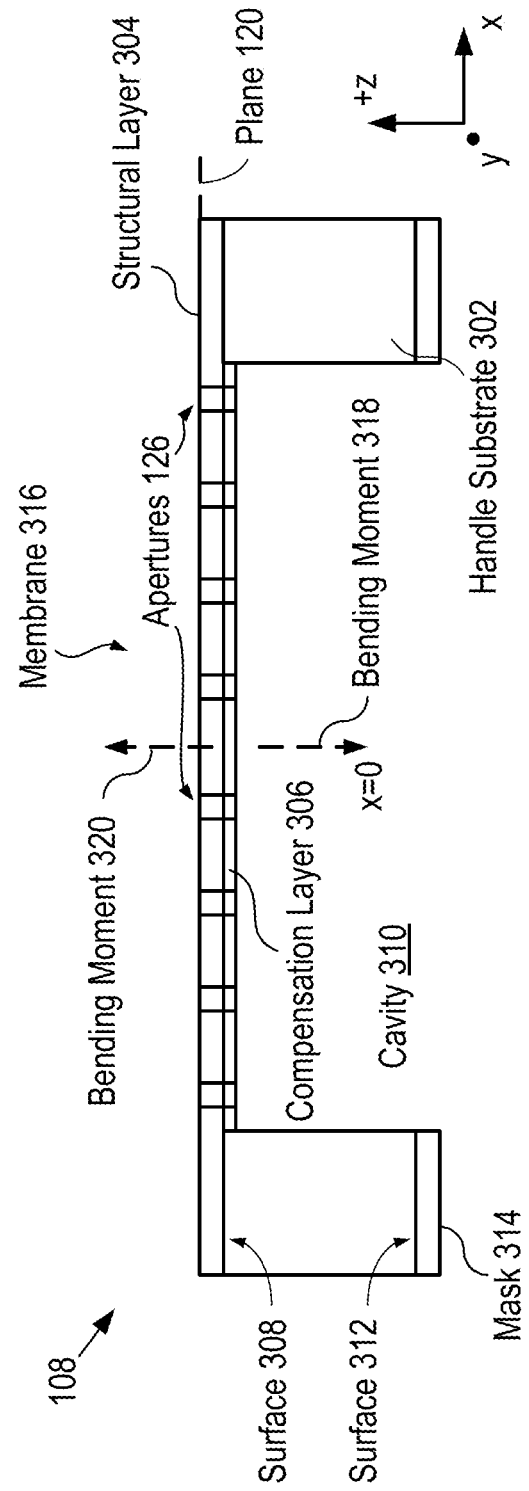
FIG. 3 depicts a schematic drawing of a cross-sectional view of a shadow mask comprising a compensation layer in accordance with an illustrative embodiment of the present disclosure.

FIG. 3 depicts a schematic drawing of a cross-sectional view of a shadow mask comprising a compensation layer in accordance with an illustrative embodiment of the present disclosure. Shadow mask 108 includes handle substrate 302, structural layer 304, apertures 126, and compensation layer 308.

Figure 4:
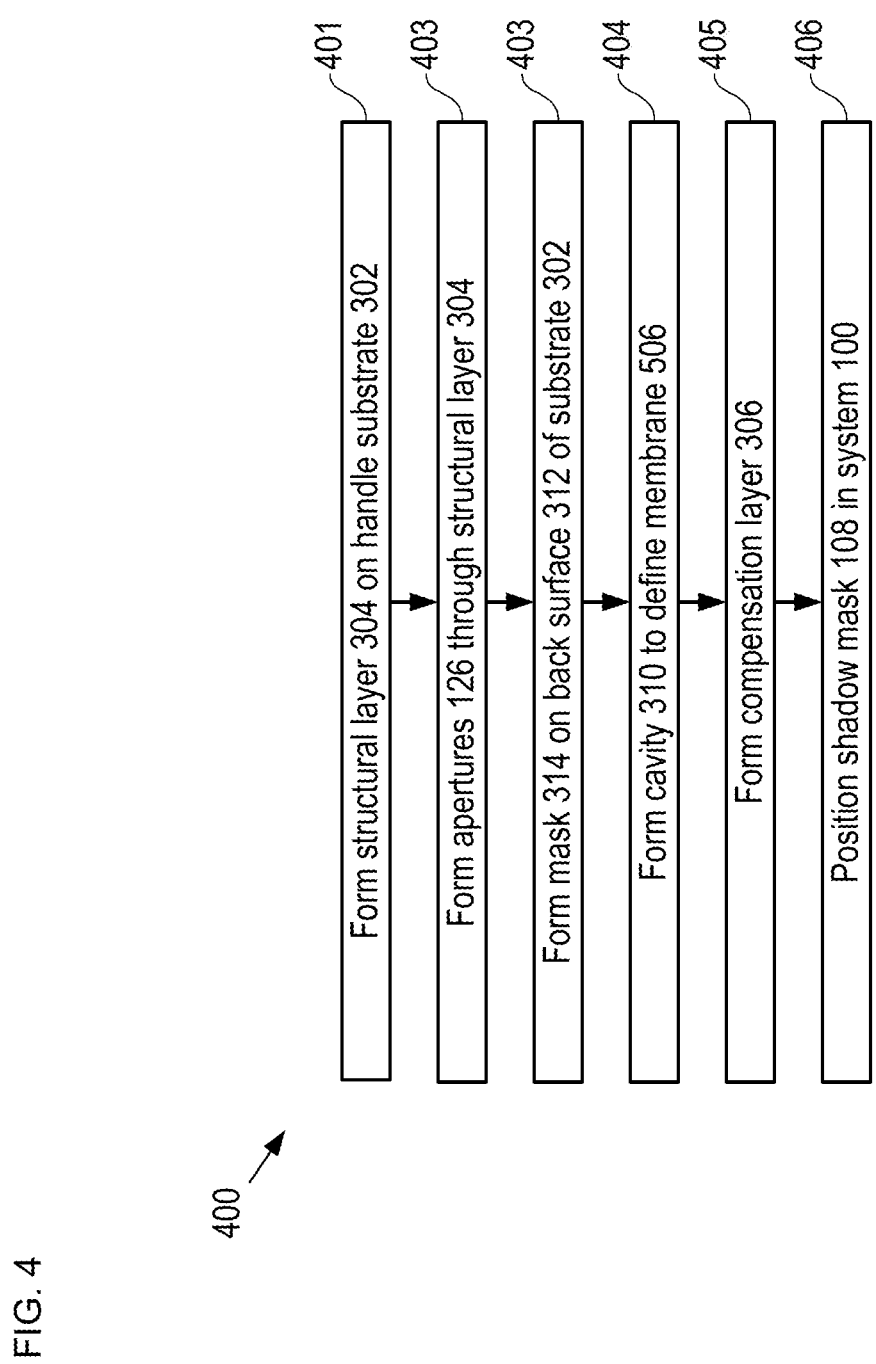
FIG. 4 depicts operations of a method for forming a shadow mask that is compensated for the effect of gravity in accordance with the present disclosure.

FIG. 4 depicts operations of a method for forming a shadow mask that is compensated for the effect of gravity in accordance with the present disclosure. Method 400 is described herein with continuing reference to FIG. 3, as well as reference to FIGS. 5A-D. Method 400 begins with operation 401, where structural layer 304 is formed on handle substrate 302.

Handle substrate 302 is a conventional silicon wafer suitable for use in planar processing; however, substrate 302 can be any suitable material without departing from the scope of the present disclosure.

Structural layer 304 is analogous to structural layer 204; however, in the depicted example, structural layer 304 is a layer of silicon-rich silicon nitride having a residual tensile stress of approximately 250 MPa. In the depicted example, structural layer 304 has a thickness of approximately 1 micron; however, other practical thicknesses can be used without departing from the scope of the present disclosure. It should be noted that the top surface of structural layer 304 defines plane 120.

Although the illustrative embodiment includes a structural layer made of silicon-rich silicon nitride, in some embodiments, a different structural material is used for structural layer 304. Materials suitable for use in structural layer 304 include, without limitation, single-crystal silicon, silicon carbide, aluminum oxide, germanium, compound semiconductors, and the like. In some embodiments, structural layer 304 is a layer of structural material formed on a separate handle substrate, where the structural layer is bonded to substrate 302 followed by removal of the handle substrate. In such embodiments, structural layer 304 can comprise additional materials, such as glasses, ceramics, etc., which would be characterized by significant compressive stress if deposited directly on substrate 302 in conventional fashion.

In the depicted example, the LPCVD deposition of structural layer 304 on front surface 308 results in deposition of its material on back surface 312 of substrate 302. The layers formed on back surface 312 collectively define mask layer 502. In some embodiments, mask layer 502 includes one or more different materials that are suitable for protecting a portion of back surface 312 during the formation of cavity 310. In some embodiments, mask layer 502 is formed independently of structural layer 304 in a separate operation or set of operations.

FIG. 5A depicts a schematic drawing of a cross-sectional view of nascent shadow mask 108 after the formation of structural layer 304 on front surface 308 and mask layer 502 on back surface 312.

At operation 402, apertures 126 are formed through the entire thickness of structural layer 304.

Apertures 126 are through-holes formed in structural layer 304 via reactive-ion etching (RIE). In some embodiments, apertures 126 are formed in another conventional manner. Apertures 126 are sized and arranged based on the desired pattern of material to be deposited on a target substrate. In some embodiments, apertures 126 are arranged to match the desired pattern of deposited material. In some embodiments, apertures 126 are arranged in a pattern that compensates for feathering across the area of the substrate. Typically, apertures 126 are formed through structural layer 304 before the formation of cavity 310.

At operation 403, mask 314 is formed on back surface 312 of substrate 302. Mask 314 is formed by patterning layer 502 is patterned, typical via photolithography and reactive-ion etching (or another conventional etching process) to define opening 504, thereby exposing the central region of back surface 312.

FIG. 5B depicts a schematic drawing of a cross-sectional view of nascent shadow mask 108 after the definition of apertures 126 and mask 314.

At operation 404, membrane 506 is defined by releasing the central portion of structural layer 304 from substrate 302 by forming cavity 310.

Cavity 310 is formed by removing the material in the center of handle substrate 302 while leaving the outer portion of substrate 302 as annular support frame 508, which extends around the perimeter of composite layer 304. In the depicted example, cavity 310 is formed by removing the exposed silicon region via a crystallographic dependent etch (e.g., ethylene diamine pyrocatechol (EDP), potassium hydroxide (KOH), hydrazine, etc.). In some embodiments, cavity 310 is formed via deep reactive-ion etching, or other conventional process.

As discussed above, when oriented horizontally (i.e., such that plane 120 lies in an x-y plane), released membrane 506 sags under its own weight due to gravity-induced bending moment 318, which arises from the force of gravity on structural layer 304. The amount of sag induced in membrane 506 is a function of the residual stress in structural layer 304 and its thickness. Furthermore, the magnitude, $\delta$, of the sag is a function, $\delta(x)$ of the radial distance from the center of the membrane (i.e., x=0).

Figure 5C:
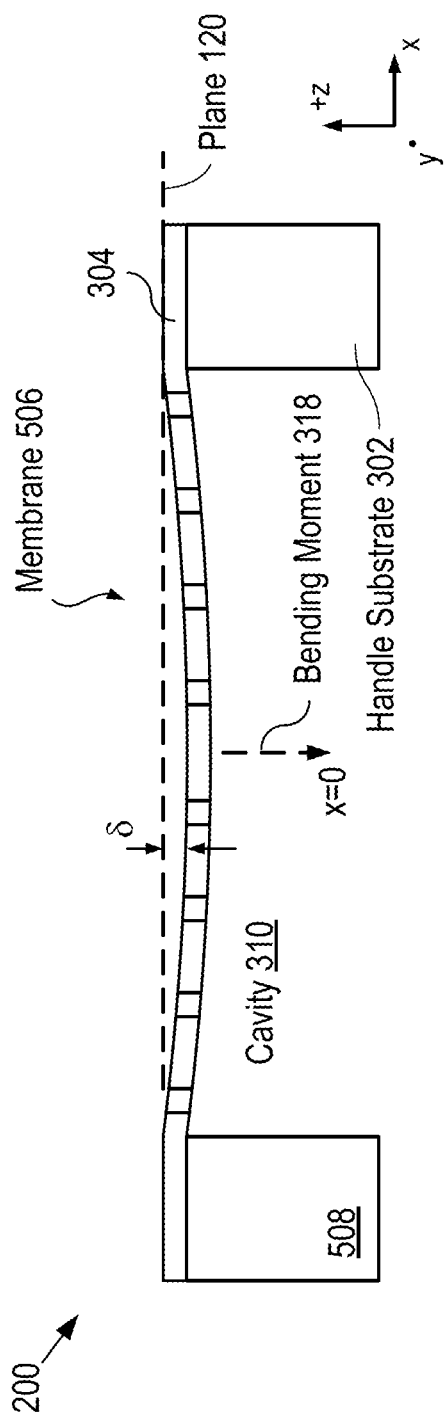
FIG. 5C depicts a schematic drawing of a cross-sectional view of nascent mask 108 after the release of membrane 506 from handle substrate 302.

FIG. 5C depicts a schematic drawing of a cross-sectional view of nascent shadow mask 108 after the release of membrane 506 from handle substrate 302.

At operation 405, compensation layer 306 is formed on the inner surface of structural layer 304 such that the layers are physically joined to collectively define membrane 316.

Compensation layer 306 is a layer of structural material having a thickness and magnitude of residual compressive stress that are selected to induce stress-induced bending moment 320 in membrane 316 that at least partially counters gravity-induced bending moment 318. Preferably, the thickness of compensation layer 218 and the magnitude of its residual stress are selected such that bending moments 318 and 320 substantially cancel each other out, resulting in the top surface of structural layer 304 lying in plane 120.

In the depicted example, compensation layer 306 is a layer of stoichiometric silicon dioxide formed via low-pressure chemical vapor deposition (LPCVD) using a precursor gas of tetraethyl orthosilicate (TEOS). Compensation layer 306 has a thickness of approximately 300 nm and a residual compressive stress of approximately 200 MPa. In some embodiments, compensation layer 306 is characterized by a different thickness and/or magnitude of compressive stress. In some embodiments, compensation layer 306 comprises a different compressively stressed material. Compressively stressed materials suitable for use in embodiments in accordance with the present disclosure include, without limitation, non-stoichiometric silicon oxides, oxides of different materials, rare-earth oxides, silicon oxynitrides, and the like.

It should be noted that, because compensation layer 306 is formed after the definition of apertures 126, in some embodiments, the material of the compensation layer deposits on the interior walls of each aperture, thereby slightly reducing their size. Typically, the thickness of compensation layer 306 is thin enough that this reduction can be ignored. In some embodiments, however, apertures 126 are designed such that they are slightly larger in cross-section to accommodate this reduction.

It should be further noted that, in some embodiments, compensation layer 306 comprises a material characterized by residual tensile stress (e.g., stoichiometric silicon nitride, silicon-rich silicon nitride having a higher residual tensile stress than structural layer 304, certain silicon oxynitrides, etc.).

In some embodiments, compensation layer 306 is disposed on the top (i.e., outer) surface of structural layer 304.

At operation 406, shadow mask 108 is positioned within system 100 such that plane 120 is horizontal (i.e., normal to the direction of gravity), thereby aligning gravity-induced bending moment 318 and stress-induced bending moment 320.

Figure 5D:
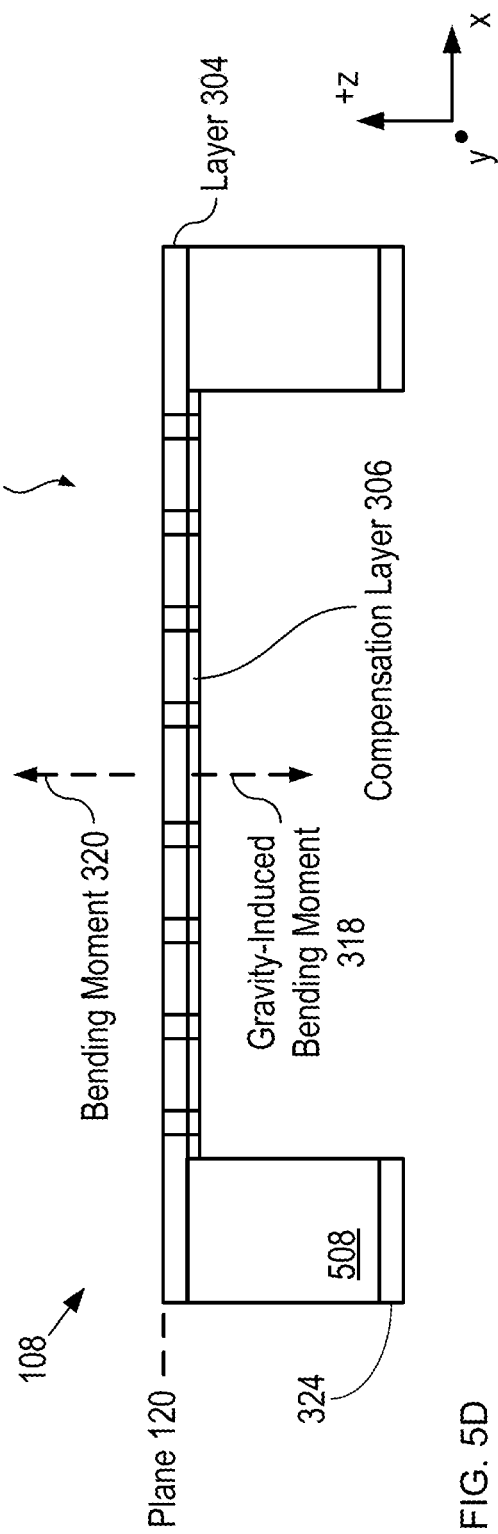
FIG. 5D depicts a schematic drawing of a cross-sectional view of shadow mask 108 positioned horizontally in system 100.

FIG. 5D depicts a schematic drawing of a cross-sectional view of shadow mask 108 positioned horizontally in system 100.

One skilled in the art will recognize, after reading this Specification, that the sign and magnitude of the residual stress of compensation layer 306, as well as its thickness and location, are based on the sign and magnitude of the residual stress of structural layer 304, as well as its thickness.

Furthermore, although the illustrative embodiment describes a shadow mask designed to be held horizontally during use, the thickness and stresses of structural layer 304 and compensation layer 306 can be selected to compensate for gravity-based sag induced by any orientation of the shadow mask during its use.

It is to be understood that the disclosure teaches just some embodiments in accordance with the present disclosure and that many variations can easily be devised by those skilled in the art after reading this disclosure and that the scope of the invention is determined by the following claims.

What is claimed is:

1. A method for compensating gravity-induced sag in a shadow mask during deposition of a material pattern on a target substrate, the method comprising:
   forming the shadow mask such that it includes:
      a substrate that defines a first plane, the substrate including a cavity; and
      a structural layer disposed on the substrate, the structural layer comprising a first material, the structural layer having a first thickness and a first residual stress, wherein a first portion of the structural layer resides over the cavity and defines a membrane;
   defining an aperture pattern in the first portion of the structural layer, wherein the aperture pattern includes at least one aperture, and wherein the at least one aperture extends completely through the structural layer; and
   forming a compensation layer on a first surface of the first portion after the aperture pattern has been defined, the compensation layer comprising a second material and having a second thickness and second residual stress;
   wherein the second thickness and second residual stress are selected such that the compensation layer induces a first bending moment in the membrane, the first bending moment being directed along a first direction that is substantially normal to the first plane.

2. The method of claim 1 further comprising forming the structural layer such that the first material is a first-silicon-rich silicon nitride.

3. The method of claim 2 further comprising forming the compensation layer such that the second material is a second silicon-rich silicon nitride.

4. The method of claim 1 wherein structural layer is formed such that the first residual stress is tensile and the compensation layer is formed such that the second residual stress is compressive.

5. The method of claim 1 wherein structural layer is formed such that each of the first residual stress and the second residual stress is tensile.

6. The method of claim 1 wherein compensation layer is formed such that it includes a plurality of sub-layers.

7. The method of claim 1 wherein structural layer is formed such that the magnitude of the first bending moment is substantially equal to a second bending moment that is based on the force of gravity on the structural membrane.

8. The method of claim 1 wherein the first thickness, second thickness, first residual stress, and second residual stress are selected such that the first bending moment induces a first force on the membrane that is directed in the first direction, and wherein a second force is induced on the membrane in a second direction due to gravity, and wherein the first direction and second direction are opposite directions.

9. The method of claim 8 wherein the first force and second force are substantially equal.

10. The method of claim 1 further comprising establishing the at least one aperture such that it has a lateral dimension that is based on (1) the desired material pattern deposited on the target substrate and (2) the second thickness.

11. The method of claim 1 further comprising depositing the material pattern on the target substrate through the structural layer and the compensation layer via the at least one aperture.

* * * * *